United States Patent
Peshkovsky et al.

(10) Patent No.: US 9,142,751 B2
(45) Date of Patent: Sep. 22, 2015

(54) EFFICIENT COOLING OF PIEZOELECTRIC TRANSDUCERS

(71) Applicant: Industrial Sonomechanics, LLC, New York, NY (US)

(72) Inventors: Alexey S. Peshkovsky, New York, NY (US); Sergei L. Peshkovsky, New York, NY (US)

(73) Assignee: Industrial Sonomechanics, LLC, New York, NY (US)

( * ) Notice: Subject to any disclaimer, the term of this patent is extended or adjusted under 35 U.S.C. 154(b) by 422 days.

(21) Appl. No.: 13/648,596

(22) Filed: Oct. 10, 2012

(65) Prior Publication Data

US 2014/0097725 A1  Apr. 10, 2014

(51) Int. Cl.
| | | |
|---|---|---|
| *H01L 41/09* | (2006.01) | |
| *H01L 41/053* | (2006.01) | |
| *B06B 1/06* | (2006.01) | |
| *G10K 11/00* | (2006.01) | |

(52) U.S. Cl.
CPC ............ *H01L 41/053* (2013.01); *B06B 1/0611* (2013.01); *G10K 11/002* (2013.01); *Y10T 29/42* (2015.01)

(58) Field of Classification Search
CPC ...... H01L 41/053; H01L 41/083; H03H 3/02; H03H 3/04; H03H 9/1007; F02M 61/167
USPC .......................................... 310/340, 346, 366
See application file for complete search history.

(56) References Cited

U.S. PATENT DOCUMENTS

| | | | | |
|---|---|---|---|---|
| 4,553,059 | A * | 11/1985 | Abe et al. ....................... | 310/328 |
| 5,664,456 | A * | 9/1997 | Eckert .......................... | 73/290 V |
| 6,454,239 | B1 * | 9/2002 | Boecking ................. | 251/129.06 |
| 6,700,308 | B2 * | 3/2004 | Heinz ........................... | 310/328 |
| 6,781,289 | B2 * | 8/2004 | Heinz et al. ................... | 310/346 |
| 7,714,483 | B2 * | 5/2010 | Hess et al. .................... | 310/346 |
| 7,839,056 | B2 * | 11/2010 | Friedl ........................... | 310/338 |
| 2003/0006299 | A1* | 1/2003 | Neretti et al. .............. | 239/102.2 |
| 2005/0072863 | A1* | 4/2005 | Bachmaier et al. .......... | 239/584 |
| 2009/0253846 | A1* | 10/2009 | Fukui ............................ | 524/430 |

* cited by examiner

*Primary Examiner* — Thomas Dougherty
(74) *Attorney, Agent, or Firm* — David L. Nocilly; Bond Schoeneck & King, PLLC

(57) ABSTRACT

A sealed piezoelectric transducer having a single, uniform, electrically insulating, heat-conducting layer of a soft, rubbery material filled with a fine, homogeneously-dispersed powder having high thermal conductivity. The material is placed in contact with the surfaces of the transducer and conducts the heat from the surfaces to an external heat sink. Since the thermally conductive powder is fully encapsulated in the rubbery material, its abrasive properties are neutralized. The softness of the material ensures that the vibration of the transducer does not transmit significant acoustic energy into the material, thereby avoiding the generation of parasitic heat. In addition, the layer fills the entire gap between the transducer and the heat sink, thereby removing any possibility of moisture-related arcing.

20 Claims, 9 Drawing Sheets

EFFICIENT COOLING OF PIEZOELECTRIC TRANSDUCERS

BACKGROUND OF THE INVENTION

1. Field of the Invention

The present invention relates to external cooling of high-power piezoelectric transducers and, more particularly, toward a heat conducing layer for cooling piezoelectric transducers.

2. Description of the Related Art

The world industry produces a large number of standard piezoelectric transducers. A piezoelectric transducer is a device which converts high-frequency alternating electrical current to mechanical vibrations. High voltages (up to several kilovolts) and high currents (up to several amperes) are commonly supplied to its piezoceramic element rings. This requires the internal area of a transducer to be free from moisture or any other contamination that may lead to electrical arcing.

It is well-known that substantial heat is released during the operation of a piezoelectric transducer, which, unless removed, worsens the transducer's performance and ultimately destroys it. Heat generation relates to the dielectric properties of the transducer's piezoceramic elements as well as to the internal friction present in the transducer during operation. Efficient cooling of a piezoelectric transducer is, therefore, essential. In addition, maintaining a low working temperature of a transducer is known to significantly improve its operational parameters, make it more reliable and durable and increase its maximum output power limit.

The most common method of cooling a piezoelectric transducer is by blowing a cool, dry gas (commonly air) through its interior area. This method has several severe limitations. Due to its low heat capacity, very high air flow rates are required to cool transducers during continuous operation. At high powers, even very substantial flow rates may not be able to ensure stable and low operating temperature. The preparation of dry and cool air requires bulky equipment, such as a high-volume compressor and a desiccant inline dryer/filter. Any condensation in the tubes may be brought into the transducer by the air and cause irreversible damage. The housing of an air-cooled transducer must have an inlet and an outlet. Since the transducer is, therefore, not sealed to the environment, vapors or powders may reach its internal area where high-voltage contacts are located. Consequentially, when used in processes involving flammable or explosive materials, such as organic solvents or powders, the entire device becomes a potential explosion and fire hazard.

Several methods and designs of externally-cooled piezoelectric transducers have been suggested. In all of these methods, the transducer is placed in a sealed housing, which is equipped with a device for heat removal, such as a heat sink. For example, U.S. Pat. No. 4,169,387 by Krempl discloses a piezoelectric transducer cooled by a heat pipe system located within its housing and having mechanical contact with the transducer's surface. Cooling occurs through heat conduction created by evaporation and subsequent condensation of a liquid contained within the heat pipe system. A major disadvantage of this cooling method is its applicability only to low-power, low-amplitude transducers, such as piezoelectric pressure sensors. In the case of ultrasonic transducers, which operate at higher amplitudes, the mechanical contact of the heat pipe system with the transducer's surface and/or the system itself is likely to break.

U.S. Pat. No. 8,004,158 by Hielscher describes a stack of several transducers forming a common assembly with internal channels filled with a pressurized coolant liquid. The liquid can also flow in the space between the surface of the assembly and its housing. The heat generated by the assembly is dissipated by convection. This method's major disadvantage arises from the property of liquids brought in contact with vibrating transducer surfaces to undergo cavitation and absorb substantial amounts of acoustic energy. This sharply increases parasitic heat generation and lowers the transducers' efficiency. In addition, in this method there is a possibility of disrupting electrical contacts due to vibration-enhanced diffusion of the insulating liquid in between the transducer's piezoceramic element rings and electrodes.

In U.S. Pub. Pat. Appl. No. 2011/073,293 by Gauthier, a soft thermally-conductive wick is disclosed, which is connected between the metallic tail mass of a transducer and onto a thermal sink. Being woven from thin metallic wire strands with good heat conduction properties, the wick is soft, and neither adversely affects vibration properties of the transducer nor transmits vibrations to the thermal sink. This arrangement is quite useful for removing heat from the tail mass of a transducer; however, it does not permit heat dissipation from any location close to piezoceramic elements due to high voltages being present in that area. It is, however, essential to be able to cool the piezoceramic elements directly, since the heat is mostly generated in their ceramic material and their heat conduction properties are poor. If only the tail mass of a high-power transducer is cooled, local overheating and damage to the piezoceramic elements is likely to occur.

U.S. Pat. No. 6,481,493 by Hielscher describes a device designed to permit high-power ultrasonic transducers to operate for extended periods of time in environments with high heat and humidity. The device involves encapsulating the transducer's surface in a thin layer of silicone rubber, whose function is to electrically insulate the surface and absorb its vibrations. This "inner" layer is followed by another layer of silica sand, which is a thermally conductive material, whose function is to conduct the heat generated by the transducer to the inner wall of its sealed housing and ultimately to an external heat sink. There are several disadvantages to this "double-layer" approach. Silicone rubber is a poor heat conductor, having the thermal conductivity of only 0.15 W/m*K. Silica sand has a higher thermal conductivity (0.33 W/m*K for fine, dry powder), but is abrasive. In addition, the finely dispersed powder has a tendency to agglomerate over time, which lowers its thermal conductivity. In order to achieve sufficient rates of heat conduction from the transducer to the heat sink, it is, therefore, necessary to maintain the first, silicone rubber, layer as thin as possible (0.05-0.5 mm, as indicated in the patent). As such, the silicone rubber layer cannot completely absorb the vibrations, which results in its relative motion with respect to the silica sand layer. Due to the abrasive nature of the sand, overtime this motion results in the destruction of the silicone rubber layer, leading to the loss of electrical insulation and the possibility of arcing. If the moisture content of the sand increases as the housing vacuum seal is lost overtime, arcing may occur even if the thin silicone layer is still intact. A further disadvantage of this method is that cooling is only practically possible on the outside surface of the piezoceramic rings. Since the piezoceramic material has poor thermal conductivity, temperature gradients in the ceramics may result, causing fractures. In addition, the resulting average thermal conductivity of both layers is relatively low, which makes the cooling of high-power ultrasonic transducers during continuous operation quite challenging. Thus, this prior art method cannot fully enable continuous and safe operation of high-power piezoelectric transducers.

Based on the above, it can be concluded that an efficient and robust method for cooling high-power, high-amplitude piezoelectric transducers during continuous operation in unfavorable environments is still lacking, and an adequate and simple explosion and flame-proof cooling design for these types of transducers is not available in the prior art.

BRIEF SUMMARY OF THE INVENTION

It is an object of the present invention to provide a contact method of removing heat from the surface of a high-amplitude piezoelectric transducer and transferring the heat to the internal wall of the transducer's housing and further to an external heat sink.

It is another object of the present invention to provide a design of an explosion and flame-proof, high-power, high-amplitude piezoelectric transducer based on the aforementioned contact cooling method.

In accordance with the foregoing objects and advantages, the present invention provides a novel design and method for efficient cooling of commercial piezoelectric transducers, without their major reconstruction, resulting in an explosion and flame-proof device able to continuously operate and high powers and vibration amplitudes in unfavorable environments. The present invention utilizes a single, uniform, heat-conducting layer of a soft, rubbery material filled with a fine, homogeneously-dispersed powder having high thermal conductivity. The layer is placed in contact with transducer's surfaces and conducts the heat from the surfaces to an external heat sink. Since the thermally conductive powder is fully encapsulated in the rubbery material, its abrasive properties are neutralized. The softness of the rubbery material (e.g., silicone rubber) ensures that the vibration of the transducer does not lead to transmitting substantial acoustic energy into the material, thereby avoiding the generation of parasitic heat. In addition, the layer fills the entire gap between the transducer and the inner housing wall, thereby removing any possibility moisture-related arcing.

In a first embodiment, the present invention comprises a single, uniform (with respect to the width of the gap), electrically insulating, heat-conducting layer of a soft, rubbery material, filled with a fine, homogeneously dispersed powder having high thermal conductivity. The layer is placed in contact with the transducer's side surface and its inner housing wall, and transmits the heat from the former to the latter. The powder is fully encapsulated in the rubbery material, which neutralizes the powder's abrasive properties. The softness of the rubbery material (e.g., silicone rubber) ensures that transducer's vibrating surfaces do not transmit substantial acoustic energy into the material, thereby avoiding the generation of parasitic heat. The material fills the entire gap between the transducer's side surface and its housing wall, which removes any possibility of moisture-related arcing even if the housing is not sealed. The external heat sink may be a water cooling jacket, a pin and/or fin arrangement for air cooling or any other type used in the art.

In a second embodiment of the present invention, two uniform portions (with respect to the width of the gap) of a heat-conducting layer formed from a soft, rubbery material are used, each portion filled with a different fine, homogeneously dispersed powder having high thermal conductivity. One of the portions is electrically insulating and fills the gap between the surface of the transducer in the vicinity of piezoceramic elements, where high voltage contacts are located, and the inner housing wall. The other portion is spaced axially from and adjacent to the first portion has superior thermal conductivity and is not electrically insulating. The second portion fills the gap between the surface of the transducer in the vicinity of its tail mass, which is electrically grounded, and the inner housing wall. The overall heat conduction from the transducer to the heat sink is, therefore, enhanced.

In a third embodiment of the present invention, the first or second embodiment is combined with a modified transducer housing design. The housing has a thicker wall in the vicinity of the transducer's tail mass, thereby having a reduced internal diameter (ID) in this area. Alternatively, the ID may be effectively reduced by using a metallic insert. Thus, the gap between the tail mass and the inner housing wall is smaller than the gap between the piezoceramic element rings and the inner housing wall, which is acceptable since no high voltages are present in the vicinity of the tail mass. The overall heat conduction from the transducer's surface to the heat sink is, therefore, enhanced.

In a fourth embodiment of the present invention, a massive metallic disk or ring, which is in good thermal contact with the transducer's housing, is introduced into any of the above embodiments. The disk or ring presses axially down on the heat-conducting rubbery material, compressing it and increasing its thermal conductivity due to the reduction of the average distance between filler particles. Additionally, axial compression leads to lateral expansion of the material, which improves its contact with the transducer's surface and the inner housing wall. The overall heat conduction from the transducer to the heat sink is, therefore, enhanced. This arrangement also helps stabilize the desired longitudinal mode of transducer's vibration and reject bending modes by presenting additional impedance to the later, while not significantly affecting the former. Stability of operation and longevity of the transducer is, therefore, improved.

In a fifth embodiment of the present invention, the fourth embodiment is modified such that the metallic disk is positioned near the end face (butt) of the tail mass. Heat is then transferred from the end face to the disk by air convection resulting from acoustic streaming in the air, which is followed by further transmission of the heat through the disk material to the transducer's housing and, ultimately, the heat sink. In order to form stable air convection due to acoustic streaming, the distance between the end face and the disk must be smaller than one fourth of the wavelength of ultrasound at the given frequency of operation. The overall heat conduction from the transducer to the heat sink is, therefore, enhanced.

In a sixth embodiment of the present invention, any of the above embodiments are used in combination with a modified transducer design. Prior art transducers incorporate thin, flat metallic rings placed between piezoceramic elements, which are utilized as electrodes. In this embodiment, the metallic rings have a slightly larger outside diameter (up to several mm) than the piezoceramic element rings, and the protruding part of the metallic rings is immersed in the thermally conductive, electrically insulating rubbery material. This improves the transference of the heat from the transducer to the rubbery material and, ultimately, to the heat sink. The rubbery material dampens any parasitic vibrations of the metallic rings and insures structural stability of this arrangement. The overall heat conduction from the transducer to the heat sink is, therefore, enhanced.

In a seventh embodiment of the present invention, the objectives of the invention are achieved by modifying any of the above embodiments such that the space between the inner surface of the transducer's piezoceramic rings and the bolt holding the transducer assembly together is also filled with the thermally conductive, electrically insulating rubbery material. The material transfers the heat from the inner surface of the piezoceramic rings to the bolt, which further conducts it to the front and tail masses of the transducer and, ultimately, to the heat sink. The overall heat conduction from the transducer to the heat sink is, therefore, enhanced, and the cooling of the piezoelectric rings is more uniform.

BRIEF DESCRIPTION OF THE SEVERAL VIEWS OF THE DRAWING(S)

The present invention will be more fully understood and appreciated by reading the following Detailed Description in conjunction with the accompanying drawings, in which.

DETAILED DESCRIPTION OF THE INVENTION

Figure 1:
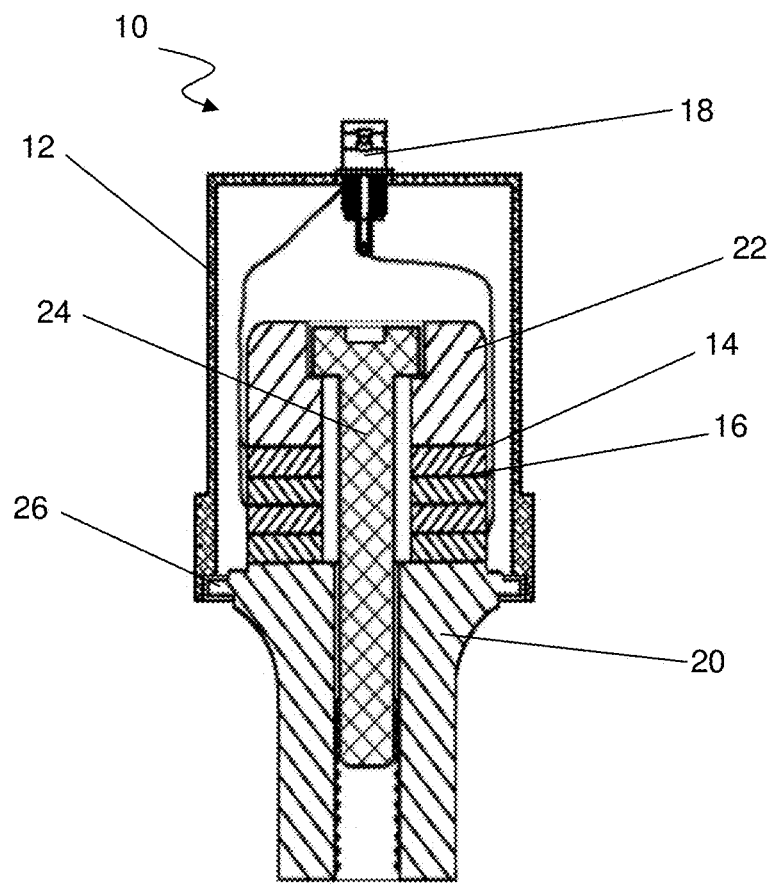
FIG. 1 is a schematic of a prior art piezoelectric transducer.

Referring now to the drawings, wherein like reference numerals refer to like parts throughout, there is seen in FIG. 1 a conventional piezoelectric transducer 10 having a sealed housing 12. Transducer 10 comprises four piezoceramic elements 14, a series of thin, flat metallic rings 16, placed in between elements 14 that serve as electrodes and are interconnected to an ultrasonic generator through a connector 18. Transducer further comprises a front mass 20 and a tail mass 22. A bolt 24 is used to hold the above components together under a pre-defined tension. Bolt 24 passes through the center of piezoceramic element rings 14 with some clearance relative to the inner surfaces of elements 14. Front mass 20 has an axial nodal location 26, which is free from any vibration and to which housing 12 is connected. Housing 12 can, therefore, seal the assembly, such that tail mass 22 and piezoceramic elements 14 of transducer 10 are not in contact with the outside environment.

Figure 2:
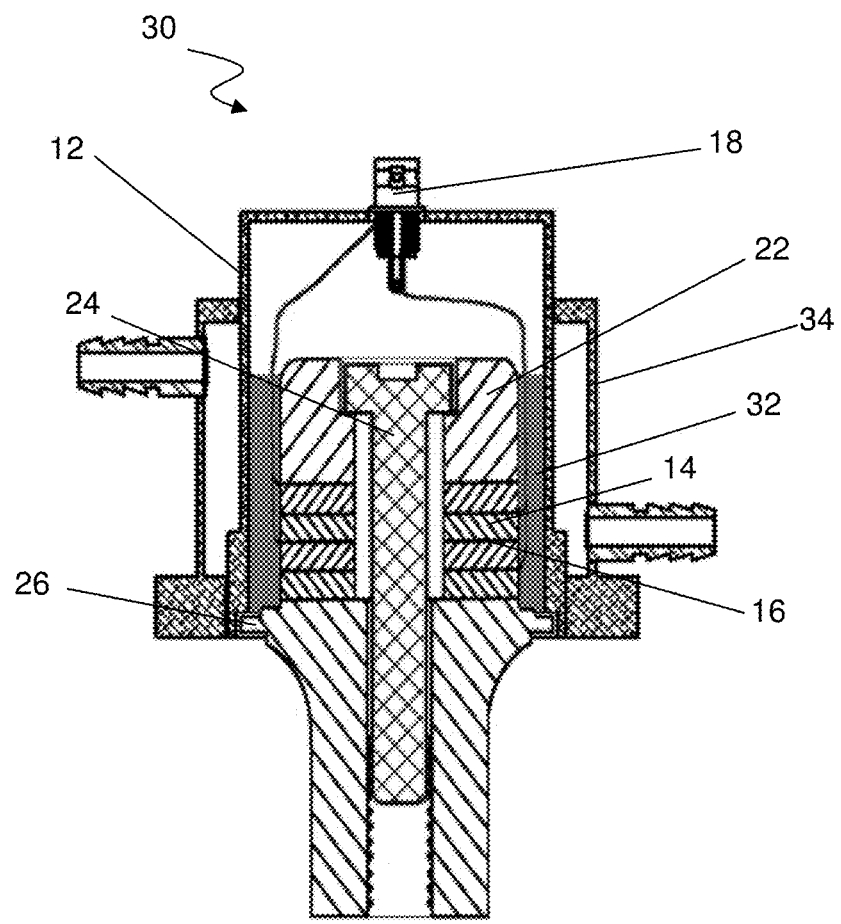
FIG. 2 is a schematic of a first embodiment of the present invention.

Referring to FIG. 2, a first embodiment according present invention comprises an explosion and flame-proof piezoelectric transducer 30 that is cooled by removing heat from the transducer's surface using a heat-conducting layer 32 and transferring it to housing 12, and further to an external heat sink 34. As seen in FIG. 2, the gap between the surfaces of piezoceramic elements 14, tail mass 26, and housing 12 is filled with a single, uniform, heat-conducting layer 32. Heat conducting layer 32 comprises a soft, rubbery material, such as an elastomer, that is filled with a fine, homogeneously dispersed powder having high thermal conductivity so that layer 32 is thermally conductive and elastomeric. Layer 32 fills the entire gap between the side surfaces of elements 14 in the vicinity of high-voltage electrode rings 16, and the wall of housing 12, which removes any possibility of moisture-related arcing even if housing 12 is not sealed. External heat sink 34 may be a water jacket, a pin, and/or a fin arrangement for air cooling, or any other type of heat sink used in the art.

Two main classes of soft, thermally conductive silicone rubber-based materials having particulate filler therein are available for use in connection with the embodiment of the present invention. Class 1 comprises thermally conductive, electrically insulating rubber which incorporates electrically non-conductive, powdered filler, such as aluminum nitride, boron nitride or other combinations, to have thermal conductivities of at least 0.5 W/m*K and, more preferably, a range of 1.5-5 W/m*K. Class 2 comprises thermally conductive, non-electrically insulating rubber which incorporates electrically conductive, powdered filler, such as aluminum, copper or silver, to have thermal conductivities in the range of 10-15 W/m*K, and possibly even higher. Thermally conductive, liquid gap filling materials acceptable for use with the present invention are commercially available from a variety of electronics product manufactures. The materials are generally formed from two components and cured either at room or elevated temperature. Prior to curing, the material maintains good thixotropic characteristics as well as low viscosity. It is a gel-like material designed to fill air gaps and voids yet flow when acted upon by an external force (e.g. dispensing or assembly process). Once cured, it remains a low modulus elastomer and has no liquid components present. Preferably, these materials should have a durometer of less than 70 according to Shore 00.

Figure 3:
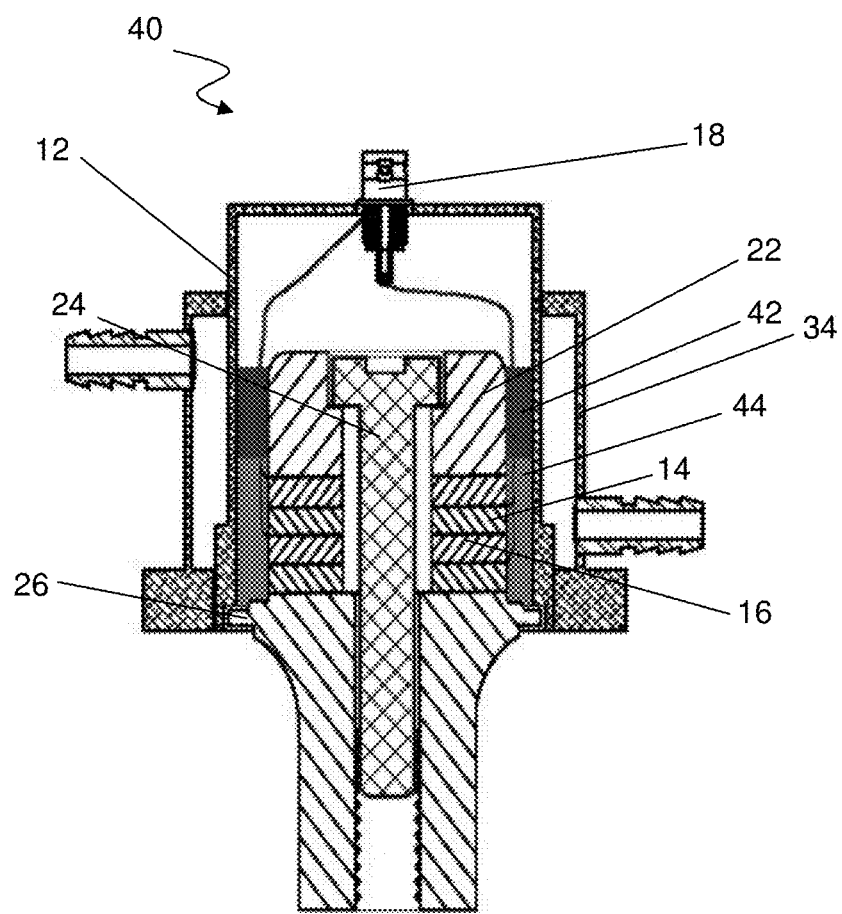
FIG. 3 is a schematic of a second embodiment of the present invention.

Referring to FIG. 3, in another embodiment of a transducer 40, a heat-conducting layer comprises an upper portion 42 having superior thermal conductivity, but with no electrical insulating qualities, as well as a lower portion of layer 44 that, like heat-conducting layer 32 of the prior embodiment, is electrically insulating and fills the gap between the surface of the transducer in the vicinity of piezoceramic elements 14. Upper portion 42 fills the gap between the surface of the transducer in the vicinity of its tail mass 22, which is electrically grounded, and the inner housing 12. The overall heat conduction from the transducer to the heat sink is, therefore, enhanced.

Figure 4:
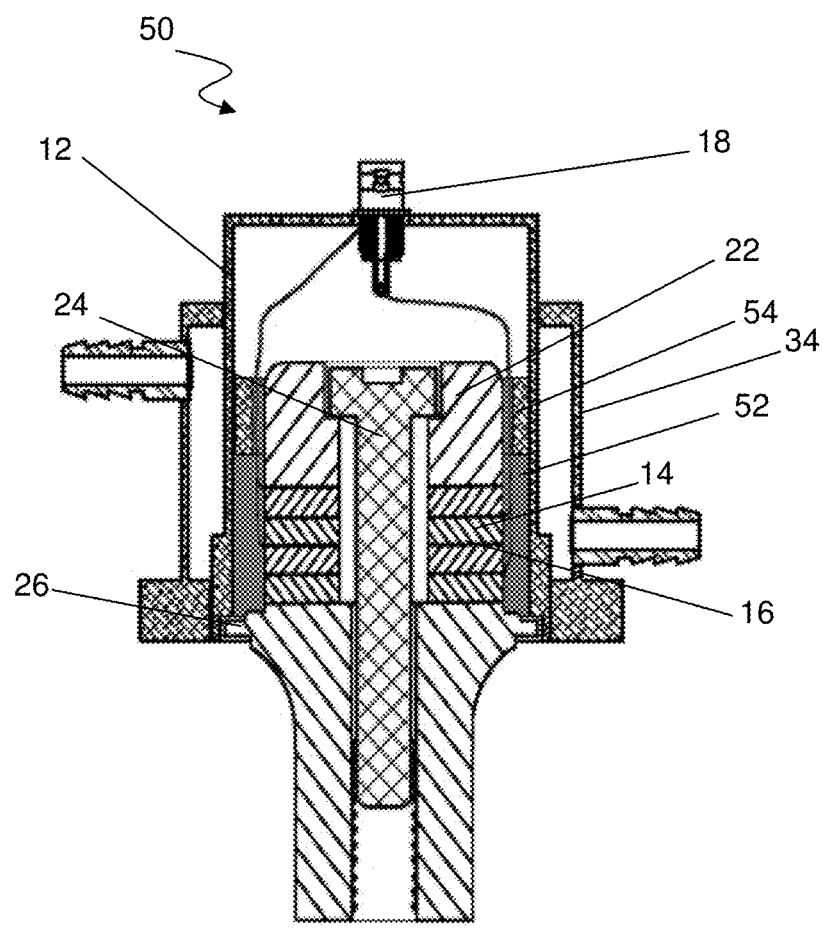
FIG. 4 is a schematic of a third embodiment of the present invention.

Referring to FIG. 4, in another embodiment of a transducer 50, a heat-conducting layer 52 is coupled with a cylindrical metallic insert ring 54 that effectively reduces the ID of the housing. Thus, the gap between tail mass 22 and the inner surface of housing 12 is smaller than the gap between the piezoceramic elements 14 and the inner wall of housing 12, which is acceptable since no high voltages are present in the vicinity of the tail mass. Alternatively, ring 54 may be integrally formed as part of the housing 12 in the location of ring 54 in FIG. 4, or housing 12 may be made thicker in lieu of including a separate ring 54. The overall heat conduction from the transducer's surface to the heat sink is, therefore, enhanced.

Figure 5:
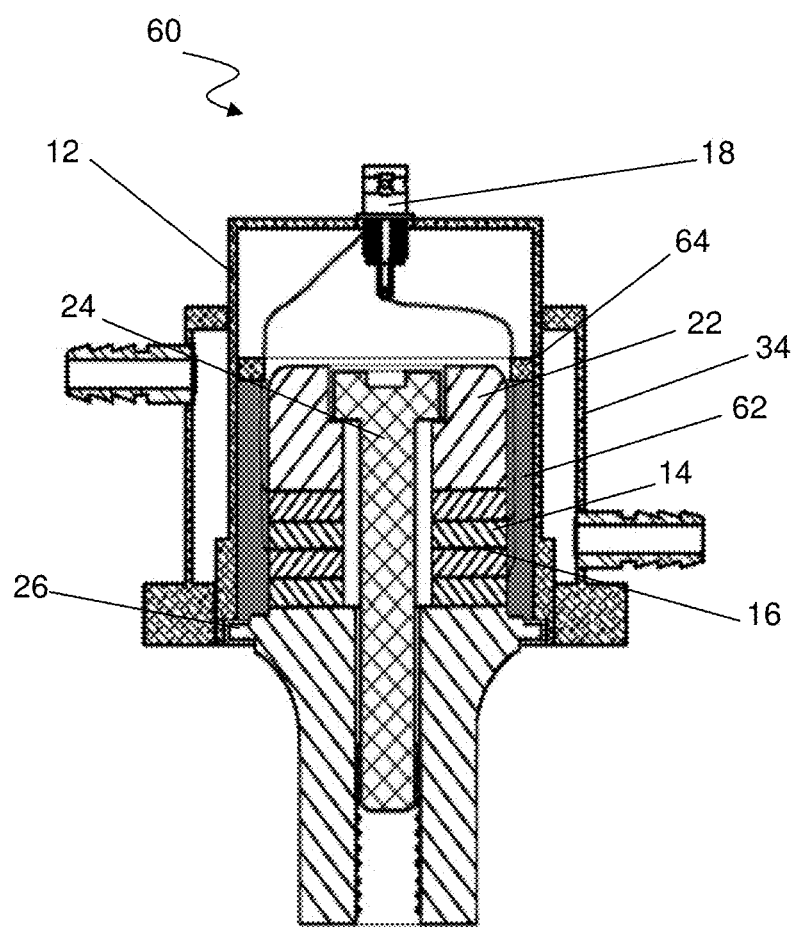
FIG. 5 is a schematic of a fourth embodiment of the present invention.

Referring to FIG. 5, in another embodiment of a transducer 60, a heat-conducting layer 62 may be coupled with a ring 64 which is biased to press axially downward onto the heat-conducting rubbery material of layer 62, thereby compressing it and increasing its thermal conductivity due to the reduction of the average distance between filler particles. Additionally, axial compression leads to lateral expansion of the material of layer 62, which improves its contact with the surface of transducer elements 14 and the inner wall of housing 12. The overall heat conduction from the transducer to the heat sink is, therefore, enhanced. This arrangement also helps stabilize the desired longitudinal mode of transducer's vibration and reject bending modes by presenting additional impedance to the later, while not significantly affecting the former. Stability of operation and longevity of the transducer is, therefore, improved.

Figure 6:
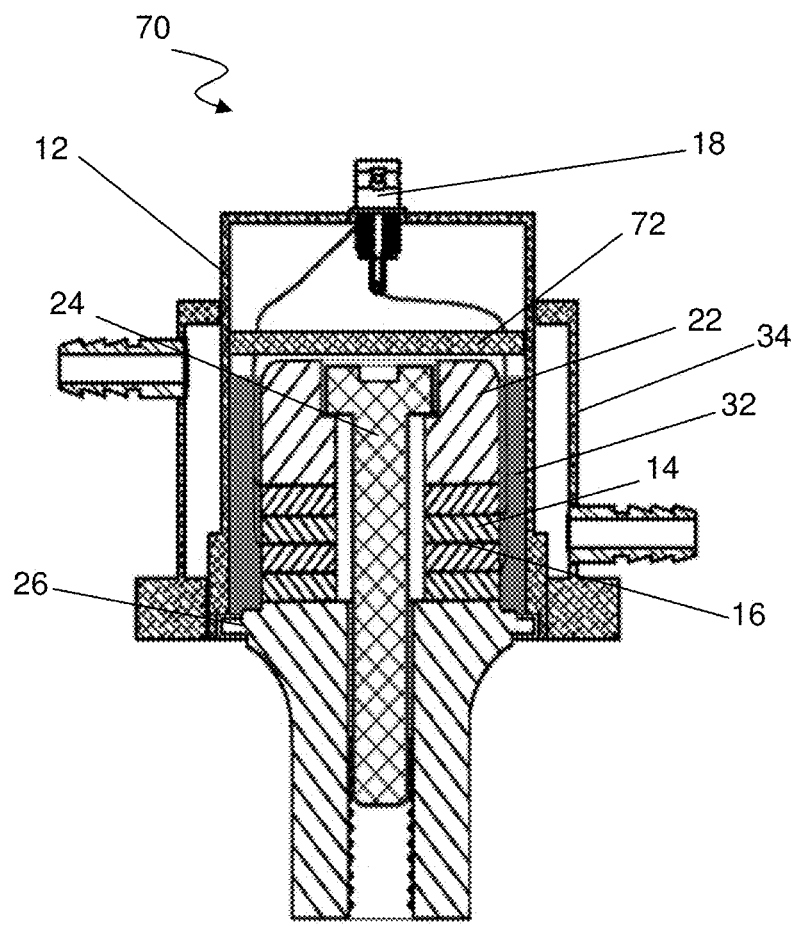
FIG. 6 is a schematic of a fifth embodiment of the present invention.

Referring to FIG. 6, in another embodiment of the invention, a metallic plate 72 is positioned near the end face (butt) of tail mass 22 of the first embodiment so that heat is transferred from the end face of tail mass 22 to plate 72 by air convection resulting from acoustic streaming in the air. Heat is further transmitted from plate 72 to housing 12 and, ultimately, heat sink 34. In order to form stable air convection due to acoustic streaming, the distance between the end face of tail mass 22 and plate 72 must be smaller than one fourth of the wavelength of ultrasound at the given frequency of operation. The overall heat conduction from the transducer to the heat sink is, therefore, enhanced.

Figure 7:
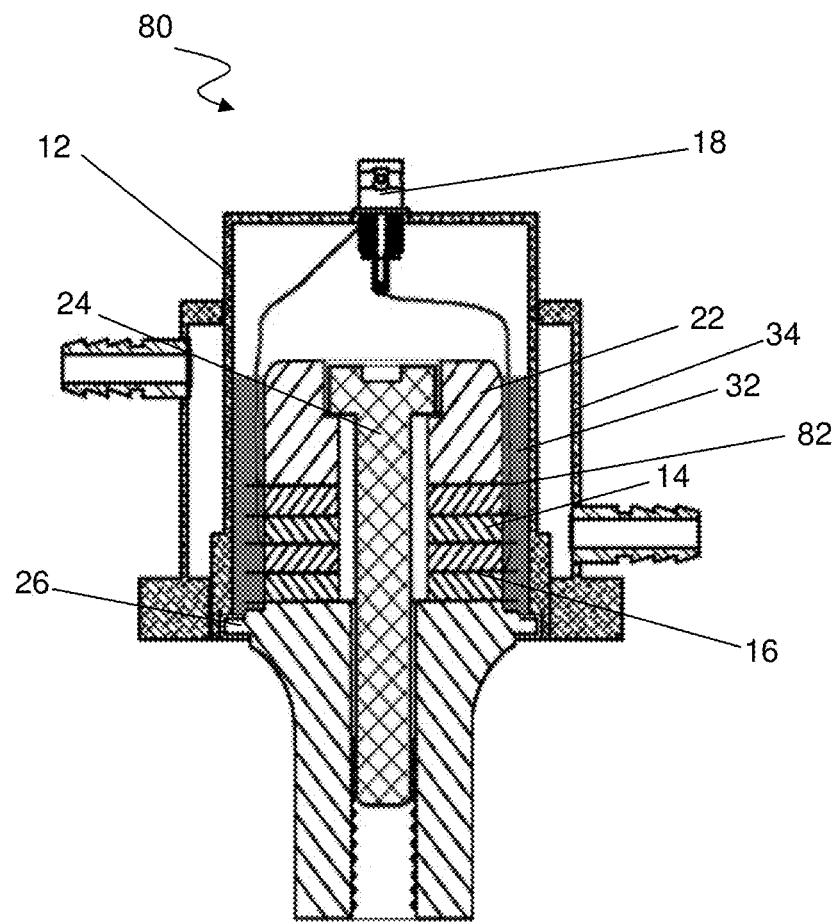
FIG. 7 is a schematic of a sixth embodiment of the present invention.

Referring to FIG. 7, in another embodiment of the invention, each thin, flat metallic rings 16 is provided with a larger outside diameter so that a portion 82 of ring 16 extends beyond elements 14 and is immersed in the thermally conductive, electrically insulating rubbery material of layer 32. This arrangement of portions 82 improves the transference of the heat from the transducer to the rubbery material and, ultimately, to the heat sink. The rubbery material of layer 32 also dampens any parasitic vibrations of the metallic rings and insures structural stability of this arrangement. The overall heat conduction from the transducer to the heat sink is, therefore, enhanced.

Figure 8:
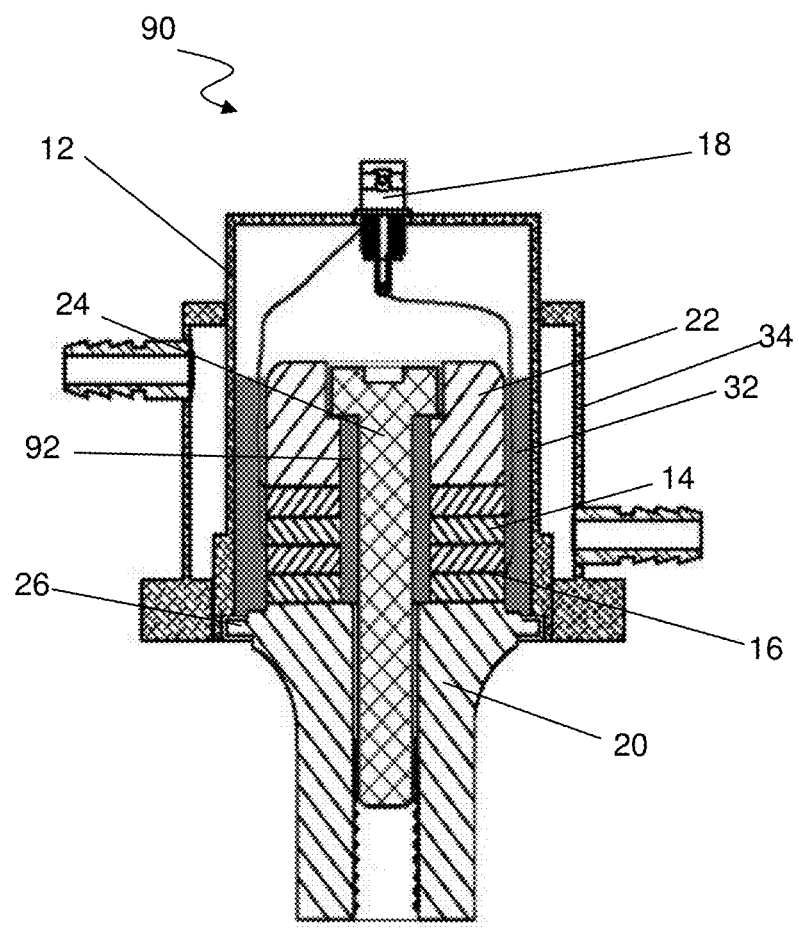
FIG. 8 is a schematic of a seventh embodiment of the present invention.

Referring to FIG. 8, in another embodiment of the invention, a transducer 90 comprises an additional layer 92 of material provided within the piezoceramic elements 14 so that the space between the inner surface of the transducer's piezoceramic elements 14 and bolt 24 holding the transducer assembly together is also filled with thermally conductive, electrically insulating rubbery material. The material of layer 92 thus transfers the heat from the inner surface of piezoceramic elements 14 to bolt 24, which further conducts it to front mass 20 and tail mass 22 of transducer 90 and, ultimately, to the heat sink. The overall heat conduction from the transducer to the heat sink is, therefore, enhanced, and the cooling of the piezoelectric rings is more uniform.

EXAMPLE

In order to demonstrate the usefulness of the present invention, a prototype was constructed according to the first embodiment of the present invention, as illustrated in FIG. 2. The prototype was based on a commercially available ultrasonic transducer operating at 20 kHz, having piezoceramic ring elements of 50 mm in diameter. The transducer came with a housing, over which a water-cooling jacket was placed. The housing originally included a lid with air inlet and outlet connections. This lid was replaced by one without the connections, resulting in a housing which was completely sealed to the environment. The gap between the transducer's side surface and its inner housing wall was 5 mm. This gap was filled with a commercially available, single, uniform, heat-conducting layer of electrically insulating silicone rubber material, containing finely dispersed heat conducting powder. Initially, the material comprised two liquid parts, which were mixed and injected into the gap. After curing, the liquid content of the material was negligible. The hardness (Shore 00) of the material was 35, and its thermal conductivity was 3.6 W/m*K.

All experiments were conducted using a commercial industrial-scale ultrasonic system (ISP-3000, Industrial Sonomechanics, LLC, New York, N.Y.) able to output up to 3 kW of acoustic power into liquids. The prototype transducer of the present invention was used in conjunction with an ultrasonic generator (3 kW) and Full-wave Barbell Horn (FBH, 38 mm output diameter), as described in U.S. Pat. No. 7,156,201, hereby incorporated by reference. The prototype transducer was cooled by water flowing through its cooling jacket. The temperature of the cooling water was 21° C. and its flow rate was 5 L/min. The working liquid serving as the acoustic load for the system was water contained in a 20 L batch tank. The amplitude of the output tip of FBH was fixed at 100 microns peak-to-peak. At this fixed amplitude, the output power of the generator (equal to the input power of the prototype transducer) could be adjusted between the values of 126 and 2000 W by the depth of immersion of the horn into the water, where 126 W corresponded to FBH being completely out of the water, and 2000 W corresponded to FBH entirely immersed. The power was monitored by a device integrated into the generator.

Figure 9:
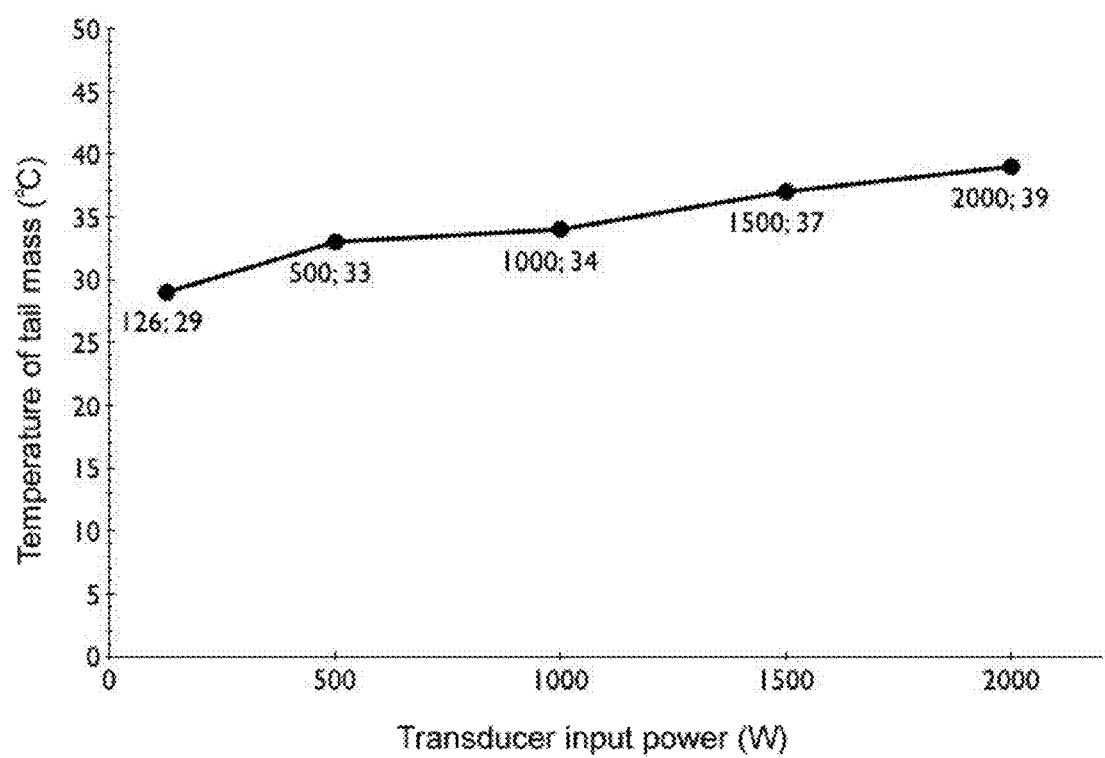
FIG. 9 is a graph of the results of testing a prototype of the present invention.

FIG. 9 shows the dependence of the transducer's tail mass temperature on the input power. It is evident that despite the relatively high cooling water temperature of 21° C. and its relatively low flow rate of 5 L/min (conservative cooling conditions), the temperature of the transducer did not change significantly as its operating power increased. The prototype transducer operated continuously for 10 hours without any loss of temperature stability or any damage. In addition, operating the transducer in a high-humidity environment with the lid of its housing removed showed no changes in performance, demonstrating that the disclosed method and design of cooling piezoelectric transducers introduces protection against hostile environmental conditions even if the housing seal is broken.

The present invention may be used in ultrasonic liquid processors and ultrasonic welders. The invention may also be used for cooling such devices as piezoelectric actuators, pressure transducers, ultrasonic imaging transducers, piezoceramic sonar array transducers, and many others.

What is claimed is:

1. A piezoelectric transducer, comprising:
a housing having an inner wall defining an internal diameter;
a series of piezoceramic elements positioned within said internal diameter of said housing and spaced apart from said inner wall to form a gap between said piezoceramic elements and said inner wall;
a layer of a thermally conductive, electrically insulating elastomer positioned in said gap and in contact with said elements and said inner wall of said housing; and
a heat sink positioned about the housing.

2. The piezoelectric transducer of claim 1, wherein said thermally conductive elastomer comprises an elastomer having a thermally conductive powder dispersed therein.

3. The piezoelectric transducer of claim 2, wherein said thermally conductive elastomer has a durometer of less than 70 according to Shore 00 and a thermal conductivity of at least 0.5 W/m*K.

4. The piezoelectric transducer of claim 1, further comprising a tail mass positioned adjacently to one end of piezoceramic elements and spaced apart from said housing to form a second gap in communication with said first gap.

5. The piezoelectric transducer of claim 4, wherein said elastomer is also positioned in said second gap.

6. The piezoelectric transducer of claim 4, further comprising a non-electrically insulating, thermally conductive elastomer positioned in said second gap and contacting said tail mass.

7. The piezoelectric transducer of claim 4, further comprising a metal plate positioned in covering relation to said tail mass and spaced apart from said tail mass by a distance that is less one fourth of the sound wavelength in the air at the frequency of operation of said piezoelectric transducer.

8. The piezoelectric transducer of claim 4, wherein said housing has a reduced internal diameter adjacent to said tail mass.

9. The piezoelectric transducer of claim 8, wherein said reduced internal diameter is formed by a reducing ring positioned within said housing and within said gap.

10. The piezoelectric transducer of claim 4, further comprising a ring positioned in said gap and compressing said elastomer.

11. The piezoelectric transducer of claim 1, further comprising a series of electrodes, each of which is positioned between each of said piezoceramic elements, wherein each of said electrodes comprises a metallic ring having an outer edge that extends beyond said piezoceramic elements into said gap to engage said thermally conductive elastomer.

12. The piezoelectric transducer of claim 1, further comprising:
 a bolt extending through said housing and said piezoceramic elements that is spaced apart from said piezoceramic elements to form an inner gap therebetween; and
 an inner layer of thermally conductive elastomer positioned in said inner gap.

13. A method of improving the heat transfer in a piezoelectric transducer having a housing and a series of piezoceramic elements positioned in the housing to form a gap therebetween, comprising the steps of:
 providing a layer of a thermally conductive, electrically insulating elastomer in said gap;
 providing a heat sink positioned around the housing.

14. The method of claim 13, wherein said thermally conductive elastomer has a durometer less than 70 according to Shore 00 and a thermal conductivity of at least 0.5 W/m*K.

15. The method of claim 13, further comprising the step of providing a thermally conductive, non-electrically insulating elastomer spaced axially from and adjacent to thermally conductive, electrically insulating elastomer.

16. The method of claim 13, further comprising the step of reducing the internal diameter of said housing adjacent to a portion of said gap.

17. The method of claim 13, further comprising the step of positioning a ring in said gap and biasing said ring to compress said thermally conductive elastomer.

18. The method of claim 13, further comprising the step of positioning a metal plate in said housing in covering relation to any tail mass in said housing so that said metal plate is spaced apart from said tail mass by a distance that is less one fourth of the sound wavelength in the air at the frequency of operation of said piezoelectric transducer.

19. The method of claim 13, further comprising the step of providing a series of electrodes, wherein each of which comprises a metallic ring having an outer edge extending beyond said piezoceramic elements into said gap and engaging said thermally conductive elastomer.

20. The method of claim 13, further comprising the step of providing a bolt extending through said housing and said piezoceramic elements that is spaced apart from said piezoceramic elements to form an inner gap therebetween and an inner layer of thermally conductive elastomer positioned in said inner gap.

* * * * *